United States Patent

Haenichen et al.

(10) Patent No.: US 7,586,245 B2
(45) Date of Patent: Sep. 8, 2009

(54) USING PRISMATIC MICROSTRUCTURED FILMS FOR IMAGE BLENDING IN OLEDS

(75) Inventors: Lukas Haenichen, Anspach (DE); Florian Pschenitzka, San Francisco, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 446 days.

(21) Appl. No.: 11/215,548

(22) Filed: Aug. 29, 2005

(65) Prior Publication Data

US 2007/0046161 A1 Mar. 1, 2007

(51) Int. Cl.
*H01J 5/16* (2006.01)
*H01J 1/62* (2006.01)

(52) U.S. Cl. .................. 313/116; 313/504; 313/506

(58) Field of Classification Search .......... 313/116, 313/504–507, 509
See application file for complete search history.

(56) References Cited

U.S. PATENT DOCUMENTS

| 6,479,930 | B1 * | 11/2002 | Tanabe et al. ............ 313/509 |
| 6,939,189 | B2 * | 9/2005 | Wu et al. ................. 313/504 |
| 7,088,043 | B2 * | 8/2006 | Min et al. ................ 313/586 |
| 2001/0026124 | A1 | 10/2001 | Liu et al. |
| 2001/0030326 | A1 | 10/2001 | Reeh et al. |
| 2001/0033135 | A1 | 10/2001 | Duggal et al. |
| 2002/0063517 | A1 | 5/2002 | Hosokawa |
| 2003/0020399 | A1 | 1/2003 | Moller et al. |
| 2003/0111955 | A1 | 6/2003 | McNulty et al. |
| 2003/0164679 | A1 * | 9/2003 | Hamano et al. ............. 313/504 |
| 2003/0218420 | A1 | 11/2003 | Zovko |
| 2004/0046497 | A1 * | 3/2004 | Schaepkens et al. ........ 313/506 |
| 2004/0061136 | A1 | 4/2004 | Tyan et al. |
| 2004/0145308 | A1 | 7/2004 | Rossner et al. |
| 2004/0189185 | A1 * | 9/2004 | Yotsuya .................. 313/501 |
| 2004/0212296 | A1 * | 10/2004 | Nakamura et al. .......... 313/504 |
| 2004/0217702 | A1 | 11/2004 | Garner et al. |
| 2005/0023967 | A1 | 2/2005 | Gotoh et al. |
| 2005/0026530 | A1 | 2/2005 | Toguchi et al. |
| 2005/0029513 | A1 | 2/2005 | Kawashima et al. |
| 2005/0142379 | A1 * | 6/2005 | Juni et al. ............... 313/504 |
| 2005/0181232 | A1 | 8/2005 | Ricks et al. |
| 2006/0186802 | A1 | 8/2006 | Cok et al. |
| 2007/0046161 | A1 | 3/2007 | Haenichen et al. |

FOREIGN PATENT DOCUMENTS

EP 0 973 358 A1 1/2000

(Continued)

OTHER PUBLICATIONS

Anil R. Duggal et al., "Organic Light-Emitting Devices for Illumination Quality White Light", May 13, 2002, Applied Physics Letters, vol. 80, No. 19, pp. 3470-3472.

(Continued)

*Primary Examiner*—Peter Macchiarolo
(74) *Attorney, Agent, or Firm*—Fish & Richardson P.C.

(57) ABSTRACT

An apparatus such as a light source is disclosed which has an OLED device and a microstructured film disposed on the substrate or transparent electrode of said OLED device and on the exterior of said OLED device. The microstructured film contains features which diffuse light emitted by said OLED device and increase the luminance of the device.

13 Claims, 7 Drawing Sheets

FOREIGN PATENT DOCUMENTS

| | | |
|---|---|---|
| JP | 2001-148287 | 5/2001 |
| WO | WO2004/040661 A1 | 5/2004 |

OTHER PUBLICATIONS

A. Niko et al., "Red-green-blue emission or paranexaphenyl devices with color-converting media", Nov. 1997, Journal of Applied Physics, vol. 82, No. 9, pp. 4177-4182.

Shigeo Shinoya et al., "Phosphor Handbook", 1999, CRC Press LLC, pp. 736-738.

J. J. Shiang et al., "Application of radiative transport theory to light extraction from organic light emitting diodes", Mar. 1, 2004, Journal of Applied Physics, vol. 95, No. 5, pp. 2880-2888.

W. H. Melhuish, "Quantum Efficiencies of Fluorescence of Organic Substances: Effect of Solvent and Concentration of the Flourescent Solute", Feb. 1961, Journal of Phys. Chem. 65, pp. 229-235.

International Search Report and Written Opinion of the International Search Authority, International Application Serial No. PCT/EP2006/004777, Sep. 21, 2006, 9 pp.

\* cited by examiner

US 7,586,245 B2

USING PRISMATIC MICROSTRUCTURED FILMS FOR IMAGE BLENDING IN OLEDS

GOVERNMENT RIGHTS

This invention was made with Government support under Contract No. DE-FC26-04NT41947 awarded by the Department of Energy. The Government may have certain rights in the invention.

BACKGROUND

Display and lighting systems based on LEDs (Light Emitting Diodes) have a variety of applications. Such display and lighting systems are designed by arranging a plurality of photo-electronic elements ("elements") such as rows of individual LEDs. LEDs that are based upon semiconductor technology have traditionally used inorganic materials, but recently, the organic LED ("OLED") has become a potential substitute. Examples of other elements/devices using organic materials include organic solar cells, organic transistors, organic detectors, and organic lasers.

An organic OLED is typically comprised of two or more thin organic layers (e.g., an electrically conducting organic layer and an emissive organic layer which emits light) which separate an anode and a cathode layer. Under an applied forward potential, the anode injects holes into the stack of organic layers, while the cathode injects electrons. The injected holes and electrons each migrate (under the influence of an externally applied electric field) toward the opposite electrode and recombine in the emissive layer under emission of a photon. Similar device structure and device operation applies for OLEDs consisting of small molecule organic layers and/or polymeric organic layers. Each of the OLEDs can be a pixel element in a passive/active matrix OLED display or an single element used as a general area light source and the like. The construction of OLED light sources and OLED displays from individual OLED elements or devices is well known in the art. The displays and light sources may have one or more common layers such as common substrates, anodes or cathodes and one or more common organic layers sandwiched in between. They may also consist of photo-resist or electrical separators, bus lines, charge transport and/or charge injection layers, and the like. Typically, a transparent or semi-transparent glass substrate is used in bottom-emitting OLED devices.

In devices for lighting applications with separated elements emitting red, green and blue light, it is difficult to obtain white light of sufficient quality due to limited mixing of these colors. The out-coupling of generated light in single color OLED devices is limited due to inner reflection at the substrate-air-boundary caused by the significant difference in the refractive index. Currently there are few if any solutions existing to blend the light of sources with different colors to get a uniform white emission.

DETAILED DESCRIPTION

In at least one embodiment of the invention, an electroluminescent (EL) device is disclosed which utilizes 1) an OLED device including a transparent substrate; and 2) a microstructured film (preferably, prismatic) disposed in the path of light emission from the OLED device and on the outside of the OLED device on the exterior side of the substrate. In at least one embodiment of the invention, the microstructured film increases efficiency by enhancing light extraction and aids in obtaining a uniform luminance distribution. In some embodiments of the invention, in a multi-color striped OLED display, the use of microstructured film splits the emission from each stripe so that it blends with the split emission from adjacent stripes to obtain a broader emission spectrum. Such embodiments of the invention may be utilized in white lighting applications or color-tunable lighting.

Figure 1:
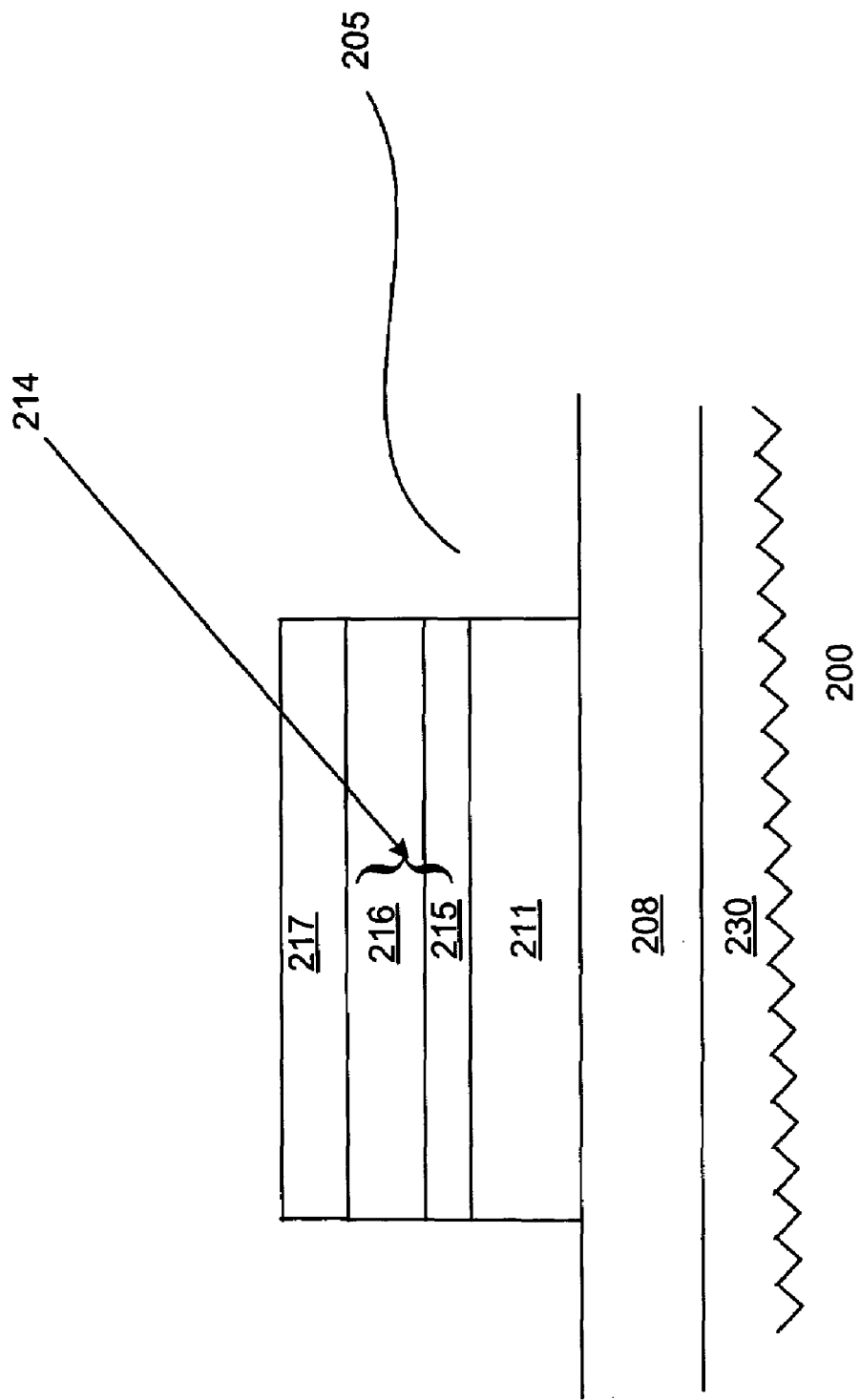
FIG. 1 shows a cross-sectional view of an embodiment of an EL device according to at least one embodiment of the invention.

FIG. 1 shows a cross-sectional view of an embodiment of an electroluminescent (EL) device 200 according to at least one embodiment of the invention. The EL device 200 includes an OLED device 205. OLED device 205 includes substrate 208 and a first electrode 211 on the substrate 208. The first electrode 211 may be patterned for pixilated applications or un-patterned for backlight or other general lighting applications. The OLED device 205 also includes a semiconductor stack 214 on the first electrode 211. The semiconductor stack 214 includes at least the following: (1) a hole injection layer/anode buffer layer (HIL/ABL) 215 and (2) an active light emitting layer (EML) 216.

As shown in FIG. 1, the OLED device 205 is a bottom-emitting device. As a bottom-emitting device, the first electrode 211 acts as an anode, and the HIL/ABL 215 is deposited onto the first electrode 211, and the EML 216 is deposited onto the HIL/ABL 215. Finally, the OLED device 205 also includes a second electrode 217 deposited onto the organic semiconductor stack 214. Other layers than that shown in FIG. 1 may also be added such as insulating layers, barrier layers, electron/hole injection and blocking layers, getter layers, and so on. In accordance with the invention, a layer 230 is disposed on the outside of the OLED device 205. More specifically, in the configuration shown, the refractive layer 230 is disposed on the substrate 208. The OLED device 205 and the refractive layer 230 together comprise the EL device 200. Exemplary embodiments of these layers are described in greater detail below.

Substrate 208:

The substrate 208 can be any material, which can support the additional layers and electrodes, and is transparent or semi-transparent to the wavelength of light emitted by the OLED device 205. Preferable substrate materials include glass, quartz, and plastic, preferably, thin, flexible glass. The preferred thickness of the substrate 208 depends on the material used and on the application of the device. The substrate 208 can be in the form of a sheet or continuous film. The continuous film is used, for example, for roll-to-roll manufacturing processes which are particularly suited for plastic, metal, and metallized plastic foils.

First Electrode 211:

In the bottom-emitting configuration, the first electrode 211 functions as an anode (the anode is a conductive layer which serves as a hole-injecting layer). Typical anode materials include metals (such as platinum, gold, palladium, indium, and the like); conductive oxides (such as lead oxide, tin oxide, indium-tin oxide, and the like); graphite; and doped conducting polymers (such as polyaniline, polypyrrole, polythiophene, and the like). Preferably, the first electrode 211 is comprised of indium-tin oxide (ITO).

The first electrode layer 211 can typically be fabricated using any of the techniques known in the art for deposition of thin films, including, for example, vacuum evaporation, sputtering, electron beam deposition, or chemical vapor deposition.

HIL/ABL 215:

The HIL/ABL 215 has good hole conducting properties and is used to effectively inject holes from the first electrode 211 to the EML 216. The HIL/ABL 215 is made of polymers or small molecule materials or other material. For example, the HIL/ABL 215 can be made from tertiary amine or carbazole derivatives both in their small molecule or their polymer form, conducting polyaniline ("PANI"), or PEDOT:PSS (a solution of poly(3,4-ethylenedioxythiophene) ("PEDOT") and polystyrenesulfonic acid ("PSS") (available as Baytron P from HC Starck). The HIL/ABL 215 can have a thickness from about 5 nm to about 1000 nm, and is conventionally used from about 50 to about 250 nm.

Other examples of the HIL/ABL 215 include copper phthalocyanine (CuPc) films with preferred thicknesses between 10 and 50 nm.

The HIL/ABL 215 can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating.

EML 216:

The active light emitting layer (EML) 216 is comprised of an organic electroluminescent material which emits light upon application of a potential across first electrode 211 and second electrode 217. The EML may be fabricated from materials organic or organo-metallic in nature. As used herein, the term organic also includes organo-metallic materials. Light-emission in these materials may be generated as a result of fluorescence or phosphorescence.

The EML 216 can be a continuous film that is non-selectively deposited (e.g. spin-coating, dip coating etc.) or discontinuous regions that are selectively deposited (e.g. by ink-jet printing). EML 216 may also be fabricated by vapor deposition, sputtering, vacuum deposition etc. as desired.

The EML 216 can be composed of at least two light emitting elements chosen (i.e. host and dopant). In the case of two light-emitting elements, the relative concentration of the host element and the dopant element can be adjusted to obtain the desired color. The EML 216 can emit light in any desired color and be comprised of polymers, co-polymers, dopants, quenchers, and hole and electron transport materials as desired. For instance, the EML 216 can emit light in blue, red, green, orange, yellow or any desired combination of these colors and in some applications, may include a combination of emitting elements which produce white light.

In addition to active electroluminescent materials that emit light, EML 216 can also include materials capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, triphenylamine, and triphenyldiamine.

Second Electrode 217:

In the bottom-emitting configuration, the second electrode 217 functions as the cathode (i.e. as the conductive layer which serves as an electron-injecting layer and which is comprised of a material with a low work function).

Microstructured Film 230

OLED device 205 as shown is a bottom-emitting OLED, and thus, the light emitted from the EML 217 passes through the substrate 208. In accordance with various embodiments of the invention, a microstructured film 230 is disposed on the exposed external side of the substrate 208 (and thus, on the exterior of the OLED device 205) to enhance the total light output from EL device 200. In at least one embodiment of the invention, the microstructured film has prismatic features on the side external to the device. These prismatic features serve to diffuse light emitted by OLED device 205. In at least one embodiment of the invention (discussed below), where a striped OLED lighting source using a plurality of devices with different emission color such as device 205 are employed, the microstructured film splits the image from one stripe into two or more images. The "split" images from adjacent stripes blend together to yield a broader color spectrum.

The chemical composition of the microstructured film 230 will depend at least in part upon the properties, e.g. the refractive index, of the substrate 208 from which light is passed to the microstructured film 230. For instance, if the substrate 208 is composed of a glass with a refractive index of about 1.48, the refractive index of the microstructured film 230 is preferably at or about 1.48 to optimize the out-coupling of light from the substrate into the refractive film. Commercially available microstructured films based on polycarbonate have a refractive index in the range of 1.5 to 1.6 which would be suitable for a glass substrate, for example. One example is a film called BEF III available from 3M Corporation which is made of a modified acrylic resin backed upon polyester. BEF III has a microreplicated prismatic structure.

Though in at least one embodiment of the invention, a prismatic microstructured film is utilized, in other embodiments of the invention, the geometry of the microstructures on the film can be any suitable geometry to achieve diffusion or refraction of light.

Figure 6:
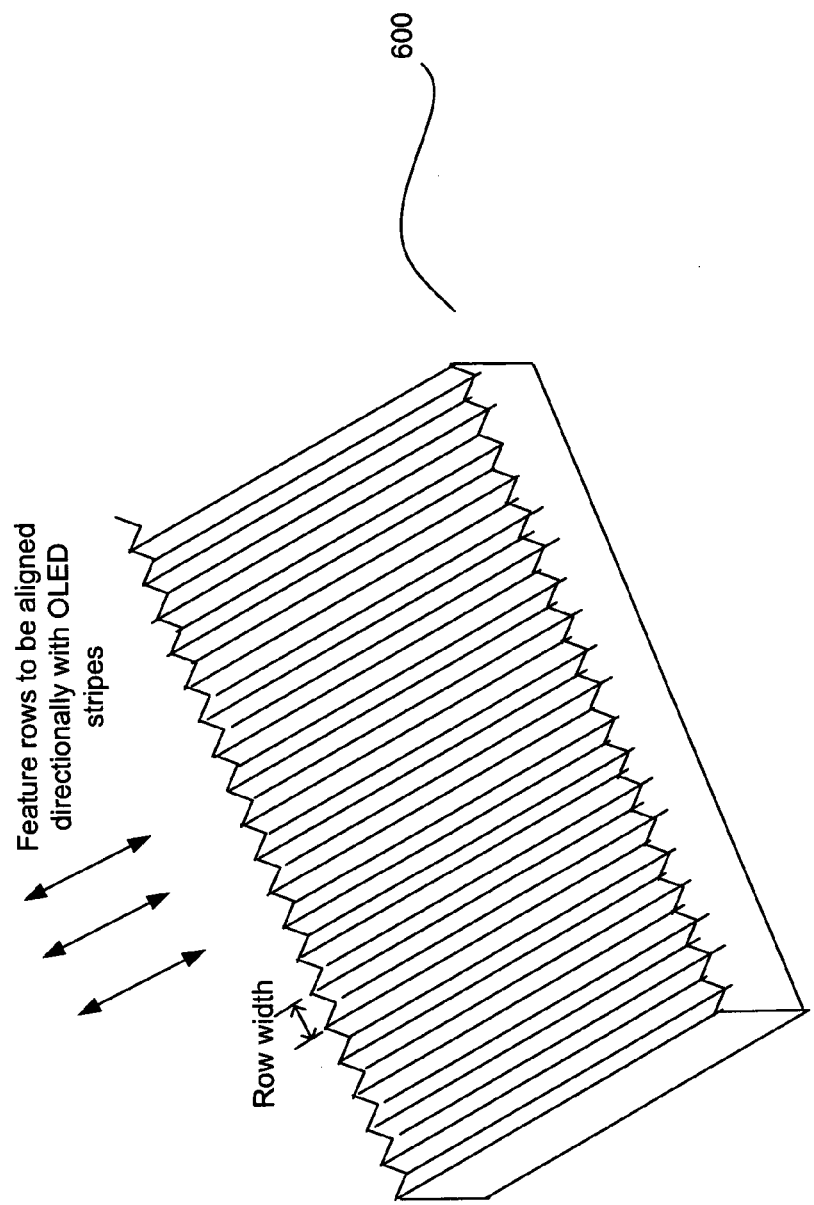
FIG. 6 illustrates a microstructured film in accordance with one or more embodiments of the invention.

The microstructured film 230 itself may have a thickness ranging from about 50 to 400 micrometers and in some embodiments around the 150-160 micrometer range. In some embodiments, the microstructured film 230 can be attached to the substrate 208 using an optically adhesive glue, which may additionally also be curable by ultraviolet radiation, or an index matching gel. In other embodiments, the microstructured film 230 can be deposited or formed directly on substrate 208. Further, the microstructured film 230 can utilize a cross-linkable material which can then be chemically bonded to the substrate 208. FIG. 6 below and the associated description detail the characteristics of microstructured films as utilized in various embodiments of the invention.

Figure 2A:
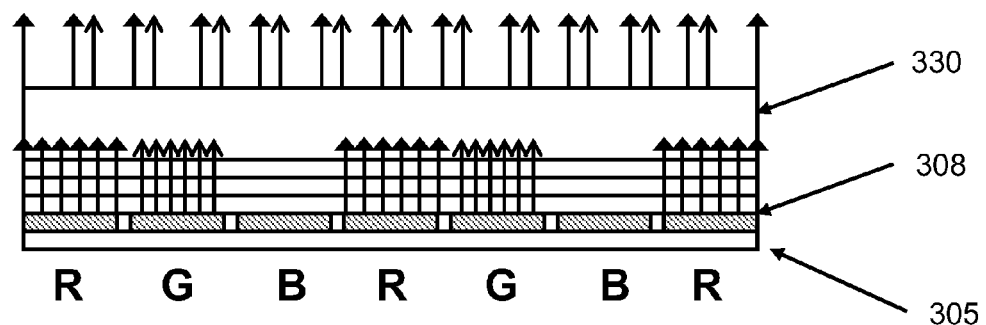
FIG. 2A shows a cross-sectional view of exemplary striped light emission in accordance with at least one embodiment of the invention.

FIG. 2A shows a cross-sectional view of exemplary striped light emission in accordance with at least one embodiment of the invention. Exemplary light rays are shown emerging from an OLED display 305. This illustrates the case of a striped multi-color OLED display 305 built upon the common substrate 308. OLED display 305 is a matrix of OLED devices with a portion of the devices emitting in red (R), a portion emitting in green (G) and a portion emitting in blue (B). Emitted light from each stripe (labeled R, G and B on FIG. 2) passes through substrate 308. In accordance with the invention, a microstructured film 330 is attached to the substrate 308. The emitted light from each R, G and B stripe is diffused by film 330 into the emissive area of adjacent stripes when the stripes of the prism in the film 330 run parallel to the emissive stripes of the device. In FIG. 2, the emission from the R stripes is shown split and diffused into the area where neighboring stripes emit. Likewise, the emission from the C stripe is also diffused into the area where its neighboring stripes emit. Though not shown specifically, a similar splitting effect would occur with respect to the emission from the R stripe as well. This has the effect of blending the emissions from each stripe. In a general lighting application where a uniform light such as white light is desirable, the blending of emitted light in this fashion can produce a broader spectrum which is also more uniform in color appearance across the display. By blending the light of the three basic colors red, green and blue in different intensities, it is possible to produce any nuance of color. This enables a color tunable light source using the diffusing properties to blend the emitted colors.

Figure 2B:
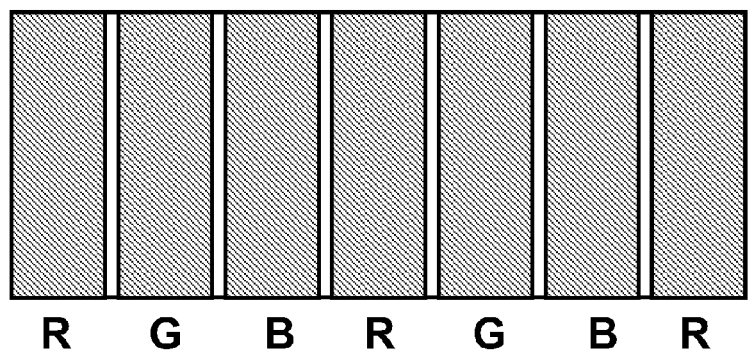
FIG. 2B shows a substrate with emissive stripes in plan view.

FIG. 2B shows a plan view of substrate 308 with neighboring emissive strips R, G and B, with diffusing film 330 removed from the device.

Figure 3:
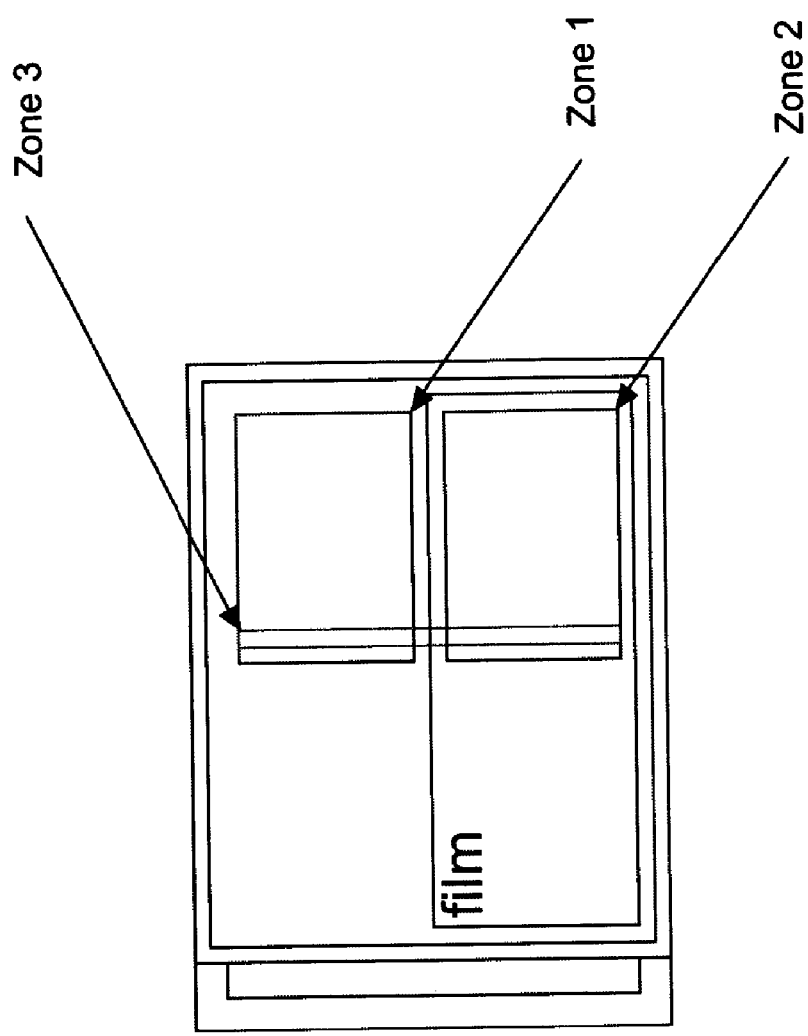
FIG. 3 illustrates the measuring zones for FIG. 4 and FIG. 5.
Figure 4:
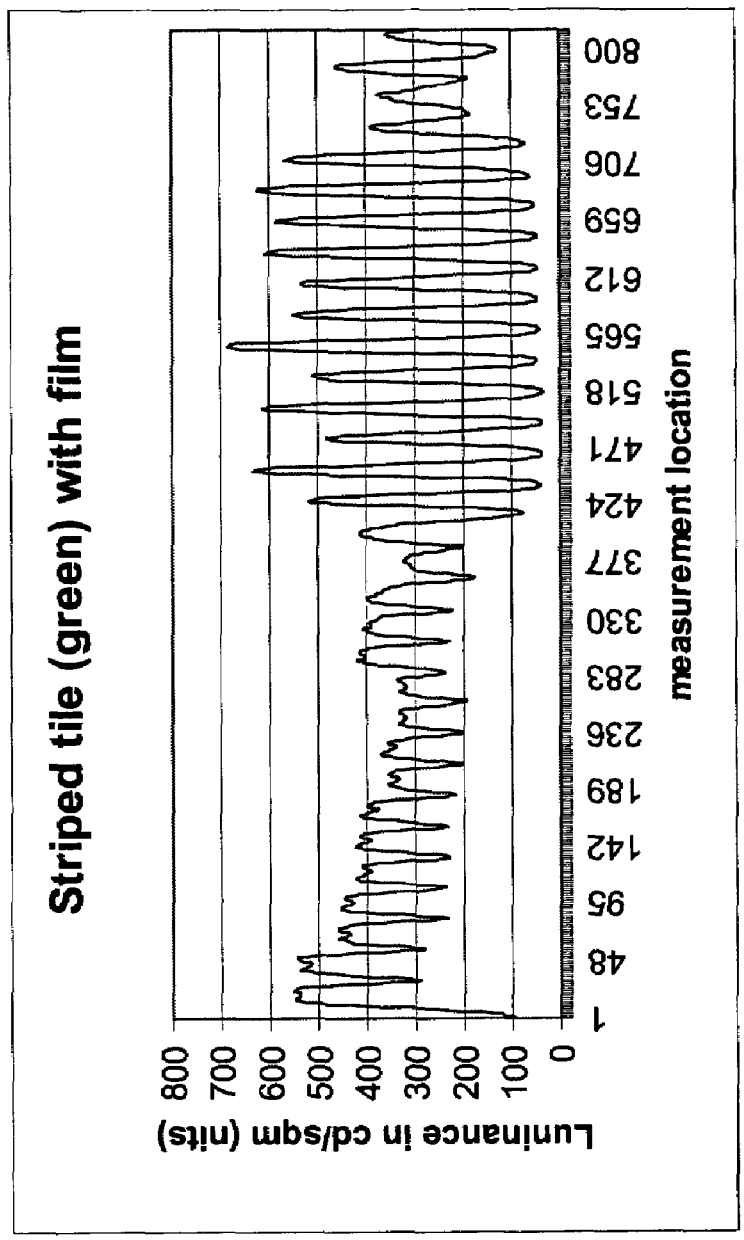
FIG. 4 illustrates the luminous efficiency for a striped OLED device emitting every third stripe using the measurement procedure shown in FIG. 3.
Figure 5:
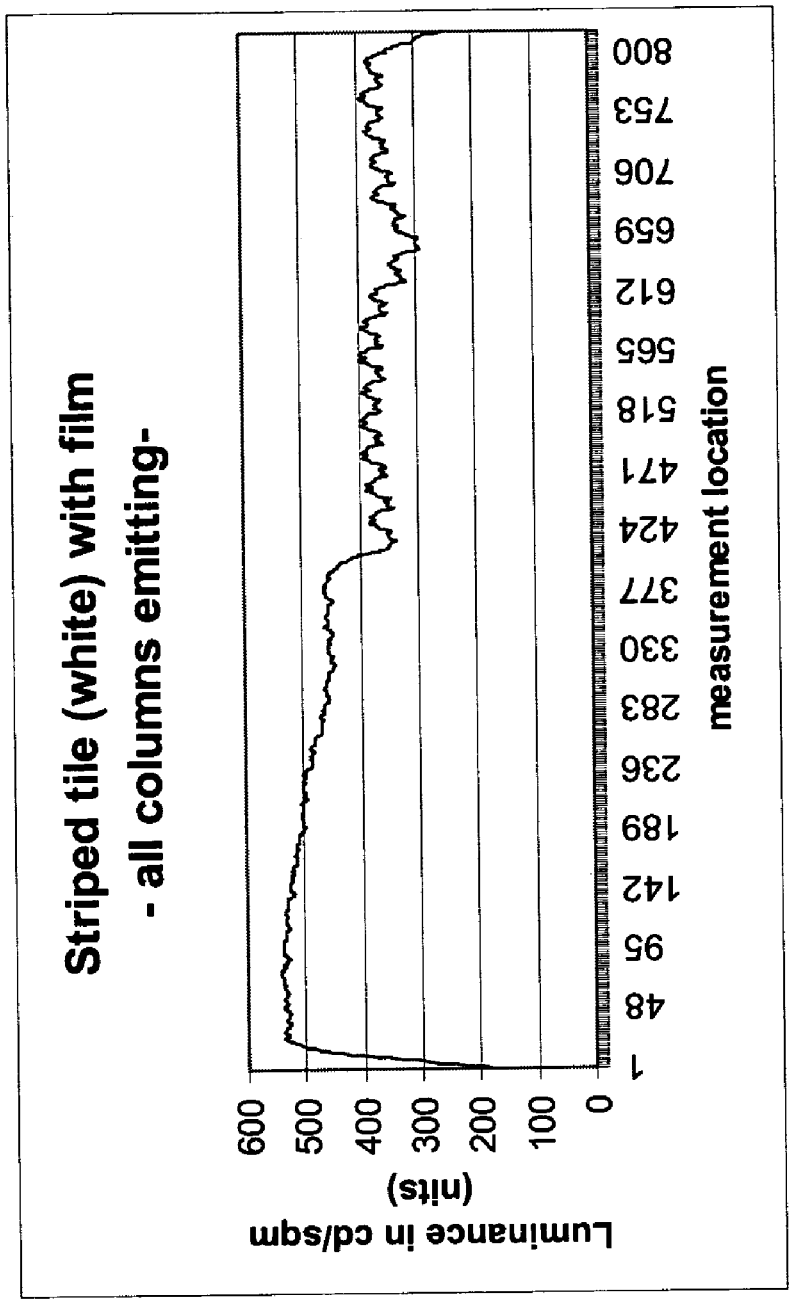
FIG. 5 illustrates the luminous efficiency for a striped OLED device emitting in all stripes using the measurement procedure shown in FIG. 3.

FIG. 3 illustrates the measuring zones for FIG. 4 and FIG. 5. An OLED lighting source was partitioned into three zones. Zone 1 is a blank domain without any microstructured film. Zone 2 is a domain wherein a microstructured film was applied on the substrate of the OLED lighting source. Zone 3 is a cross-section through both of these domains where the luminance was measured.

FIG. 4 illustrates the luminance (brightness) for a striped OLED device emitting every third stripe using the measurement system shown in FIG. 3. shows the luminance of striped OLED panel with only 'green' switched on (i.e. only every third stripe is emitting). The average luminance for zone 2 (which includes a microstructured film) was around 350 nits while the average luminance for zone 1 (same emission without a microstructured film) was around 271 nits. This is an improvement in average luminance of about 29%. Even though the peak luminance at selected locations was greater in zone 1, there were better more uniform luminance levels over a larger area in zone 2 and few large drops in luminance. For instance, the luminance levels rarely if ever dropped below 200 nits over the entire zone 2 area whereas in the zone 1 area luminance levels often drop under 100 and near 50 nits. This flattening of the luminance profile over the area of the display is due to the diffusive effect of the microstructured film. There is significant emission of even in areas where the corresponding underlying stripe is not emitting.

FIG. 5 illustrates the luminance for a striped OLED display emitting in all stripes using the measurement system shown in FIG. 3. In this case, a white emitting OLED display was measured with all stripes emitting. With all stripes emitting, there is an increase in average luminance as well an increase in luminance at given measured locations (peak luminance at each location). The average luminance for zone 2 (which includes a microstructured film) was around 488 nits while the average luminance for zone 1 (same emission without a microstructured film) was around 359 nits. This is an improvement in average luminance of about 35%. The peak luminance at selected locations was greater in zone 2, and there were more uniform and larger luminance levels over a larger area in zone 2 and few significant drops in luminance from one measured location to the next. For instance, the luminance levels rarely if ever dropped below 400 nits over the entire zone 2 area whereas in the zone 1. This flattening of the luminance profile over the area of the display is due to the diffusive effect of the microstructured film. There is a more uniform luminance profile due to the blending of light from adjacent emitting stripes.

FIG. 6 illustrates a microstructured film in accordance with one or more embodiments of the invention. In general, the invention comprises at least one microstructured film 600 which is fabricated and disposed over and on the outside of a substrate of a bottom-emitting OLED device/display. The microstructured film 600 is thus attached to the outside of the OLED device/display and not included as a part of the device/display. In this way, such a layer can be used on any OLED or similar lighting device/display independent of internal device structure. In a bottom-emitting OLED device light exits the OLED device via the substrate. The microstructured film 600 is placed in the path of light emission and thus, on the outside of the OLED device and on the outside of the substrate (bottom-emitting).

The microstructured film 600 has periodic or aperiodic and random features prismatic or otherwise lens-like which serve to diffuse light. The features may also be rounded and more smooth at peak like waves of water rather than with sharp features and angles found in a prismatic structure. The features on the surface of the film 600 are on the side distal to the side of attachment to the OLED device/display. The features are aligned in a "row" (the direction of the row indicated by the arrows in FIG. 6) and the rows are repetitively placed across the width of the film 600. In one embodiment, the stripes of a striped OLED device are parallel to the feature rows on the microstructured film. The direction in which this parallel alignment would be made is indicated in the arrows on FIG. 6. The emissive stripes of the OLED would be parallel to the arrows, for instance for the film 600 as shown. In at least one embodiment, the width of features (from row to row, peak to peak as indicated in FIG. 6) is about $\frac{1}{10}^{th}$ the width of an individual OLED stripe. Thus, there may be approximately 10 repeating rows of features on the microstructured film for each given stripe of the OLED device. In general, the width of a row is much smaller than the width of an OLED stripe such that many features can be utilized to diffuse the emission of a single stripe. In other embodiments, the width of the a row may be the same or greater than the width of a single stripe. The feature size, row size and period of the features on the film can be any suitable range and the ranges given above are merely exemplary.

Figure 7:
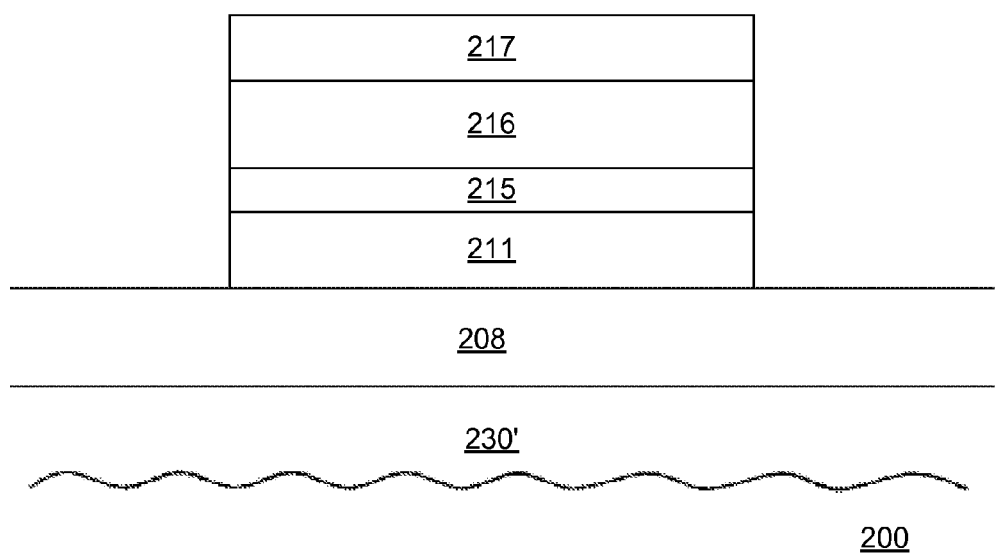
FIG. 7 illustrates a cross-sectional view of an embodiment of an electroluminescent (EL) device with a microstructured film 230' with wavelike features.

FIG. 7 shows a cross-sectional view of an OLED device having a microstructured film 230' with wavelike features.

Top Emitting OLED Devices

In an alternative configuration to that shown in FIG. 2 and described above, the first electrode 211 functions as a cathode (the cathode is a conductive layer which serves as an electron-injecting layer and which comprises a material with a low work function). The cathode, rather than the anode, is deposited on the substrate 208 in the case of a top-emitting OLED. In this alternative configuration, the second electrode layer 217 functions as an anode (the anode is a conductive layer which serves as a hole-injecting layer and which comprises a material with work function greater than about 4.5 eV). The anode, rather than the cathode, is deposited on the semiconductor stack 214 in the case of a top-emitting OLED.

In embodiments where the OLED is "top-emitting" as discussed above, the anode may be made transparent or translucent to allow light to pass from the semiconductor stack 214 through the top of the device. In such cases, the microstructured film 600 would be attached, bonded or cured to the anode 217 (or to a glass or other material which encapsulates and protects the anode) rather than to the substrate 208 as with a bottom-emitting OLED shown in FIG. 2.

The OLED lighting sources and displays produced from a combination or arrays of OLED devices described earlier can be used within applications such as information displays in vehicles, industrial and area lighting, telephones, printers, and illuminated signs.

As any person of ordinary skill in the art of light-emitting device fabrication will recognize from the description, figures, and examples that modifications and changes can be made to the embodiments of the invention without departing from the scope of the invention defined by the following claims.

What is claimed:

1. An apparatus, comprising:
    an OLED device formed as a striped OLED device having neighboring emissive stripes capable of emitting light, the OLED device comprising a light emitting layer and a transparent layer capable of at least partially transmitting light from said light emitting layer and out from the OLED device; and
    a microstructured film disposed over said transparent layer and on the exterior of said OLED device, said microstructured film having a plurality of features located distal to said transparent layer and on the outer side of said film, said features capable of diffusing said transmitted light, wherein
    the features are arranged in repeating rows across the film; and
    the neighboring emissive stripes of the swiped OLED device are aligned parallel to the rows of the features.

2. The apparatus of claim 1 wherein said transparent layer is a substrate of said OLED device.

3. The apparatus of claim 1 wherein said each of features are prismatic in geometry.

4. The apparatus of claim 1 wherein said features are periodic across said film.

5. The apparatus of claim 1 wherein said microstructured film is attached physically and/or chemically to said transparent layer.

6. The apparatus of claim 1 wherein said device is part of light source application.

7. The apparatus of claim 1 wherein said transparent layer is an anode layer of said OLED device.

8. The apparatus of claim 1 wherein the width between one row and a next row of the repeating rows is smaller than the width of an emissive stripe of the emissive stripes of said striped OLED device.

9. The apparatus of claim 1 wherein each of said features are wavelike in geometry.

10. The apparatus of claim 1 wherein said film blends the light of an emissive stripe of said striped OLED device with light of an adjacent emissive stripe of said striped OLED device.

11. The apparatus of claim 1 wherein the microstructured film has a thickness from about 50 microns to 400 microns.

12. The apparatus of claim 1 wherein the neighboring emissive stripes emit light in red, green or blue from adjacent emissive stripes, respectively.

13. The apparatus of claim 1 wherein a width of features from row to row is about $\frac{1}{10}^{th}$ a width of an emissive stripe of the striped OLED device.

* * * * *

UNITED STATES PATENT AND TRADEMARK OFFICE
CERTIFICATE OF CORRECTION

| | | |
|---|---|---|
| PATENT NO. | : 7,586,245 B2 | Page 1 of 1 |
| APPLICATION NO. | : 11/215548 | |
| DATED | : September 8, 2009 | |
| INVENTOR(S) | : Haenichen et al. | |

It is certified that error appears in the above-identified patent and that said Letters Patent is hereby corrected as shown below:

Column 7, Line 33 at Claim 1; replace:
    "the neighboring emissive stripes of the swiped OLED" with
    -- the neighboring emissive stripes of the striped OLED --

Signed and Sealed this

Twenty-seventh Day of October, 2009

David J. Kappos
*Director of the United States Patent and Trademark Office*